United States Patent
Stiglic et al.

(10) Patent No.: US 10,841,074 B2
(45) Date of Patent: *Nov. 17, 2020

(54) METHOD FOR SYNCHRONIZING AN ACTIVE LOAD MODULATION CLOCK WITHIN A TRANSPONDER, AND CORRESPONDING TRANSPONDER

(71) Applicants: STMICROELECTRONICS SA, Montrouge (FR); STMicroelectronics Razvoj Polprevodnikov d.o.o., Ljubljana (SI)

(72) Inventors: Maksimiljan Stiglic, Maribor (SI); Nejc Suhadolnik, Jezero (SI); Marc Houdebine, Crolles (FR)

(73) Assignees: STMicroelectronics SA, Montrouge (FR); STMicroelectronics Razvoj Polprevodnikov d.o.o., Ljubljana (SI)

( * ) Notice: Subject to any disclaimer, the term of this patent is extended or adjusted under 35 U.S.C. 154(b) by 0 days.

This patent is subject to a terminal disclaimer.

(21) Appl. No.: 16/725,976

(22) Filed: Dec. 23, 2019

(65) Prior Publication Data

US 2020/0136795 A1 Apr. 30, 2020

Related U.S. Application Data

(63) Continuation of application No. 16/029,457, filed on Jul. 6, 2018, now Pat. No. 10,560,255.

(30) Foreign Application Priority Data

Jul. 12, 2017 (EP) .................................. 17305918

(51) Int. Cl.
*H03D 3/24* (2006.01)
*H04L 7/033* (2006.01)
(Continued)

(52) U.S. Cl.
CPC ........ *H04L 7/0331* (2013.01); *G06K 19/0723* (2013.01); *H03C 3/095* (2013.01);
(Continued)

(58) Field of Classification Search
CPC .............. H04L 7/0331; G06K 19/0723; H03C 3/0925; H03C 3/095; H03L 7/0991;
(Continued)

(56) References Cited

U.S. PATENT DOCUMENTS 9,576,237 B2 * 2/2017 Kunc ................. G06K 19/0715
9,806,771 B1 * 10/2017 Hueber .................... H04W 4/80
(Continued)

FOREIGN PATENT DOCUMENTS

EP  2 431 925 B1  4/2013
EP  2 625 653 B1  11/2014
(Continued)

OTHER PUBLICATIONS

Extended European Search Report, dated Dec. 22, 2017, for European Application No. 17305918.9-1874, 7 pages.
(Continued)

*Primary Examiner* — Helene E Tayong
(74) *Attorney, Agent, or Firm* — Seed IP Law Group LLP (57) ABSTRACT

A transponder communicates with a reader using active load modulation. The transponder includes a digital phase locked loop (DPLL), which, in operation, generates an active load modulation (ALM) carrier clock synchronized to carrier clock of the reader. Between transmission of data frames, the DPLL is placed in a lock mode of operation in which a feedback loop of the DPLL is closed. Within a transmitted data frame having a duration, the DPLL is placed, for the duration of the transmitted data frame, in a hold mode of operation in which the feedback loop is opened. A phase of
(Continued)

the ALM carrier clock is adjusted at least once during the duration of the transmitted data frame.

22 Claims, 7 Drawing Sheets

(51) Int. Cl.
    *H04B 5/00*     (2006.01)
    *G06K 19/07*     (2006.01)
    *H03C 3/09*     (2006.01)
    *H03L 7/099*     (2006.01)

(52) U.S. Cl.
    CPC ......... *H03C 3/0925* (2013.01); *H03L 7/0991* (2013.01); *H04B 5/0031* (2013.01); *H04B 5/0056* (2013.01); *H04B 5/0062* (2013.01); *H03L 2207/50* (2013.01)

(58) Field of Classification Search
    CPC . H03L 2207/50; H04B 5/0031; H04B 5/0056; H04B 5/0062
    USPC ......................................................... 375/376
    See application file for complete search history.

(56) References Cited

U.S. PATENT DOCUMENTS

| | | | |
|---|---|---|---|
| 9,876,631 B2* | 1/2018 | van de Beek | H04L 61/1552 |
| 10,122,557 B1 | 11/2018 | Stiglic et al. | |
| 2009/0174592 A1 | 7/2009 | Muellner | |
| 2012/0071089 A1* | 3/2012 | Charrat | H04L 7/08 |
| | | | 455/41.1 |
| 2014/0003548 A1* | 1/2014 | Lefley | H04B 5/0075 |
| | | | 375/268 |
| 2015/0015343 A1* | 1/2015 | Ballantyne | H03B 5/1265 |
| | | | 331/36 C |
| 2016/0105188 A1 | 4/2016 | Cho et al. | |
| 2016/0241380 A1* | 8/2016 | Ghahramani | H04B 5/0031 |
| 2016/0241384 A1* | 8/2016 | Frantzeskakis | H04B 5/0031 |
| 2016/0294541 A1 | 10/2016 | van de Beek et al. | |
| 2017/0300723 A1* | 10/2017 | Kovacic | G06K 19/0723 |
| 2018/0034510 A1* | 2/2018 | Hueber | H04B 17/318 |
| 2018/0034621 A1* | 2/2018 | Hueber | H04L 7/033 |
| 2018/0110018 A1* | 4/2018 | Yu | H04L 7/04 |
| 2018/0227019 A1 | 8/2018 | Kovacic et al. | |

FOREIGN PATENT DOCUMENTS

| | | |
|---|---|---|
| EP | 2 727 255 B1 | 8/2015 |
| EP | 3 121 755 A1 | 1/2017 |
| EP | 3 399 655 A1 | 11/2018 |
| WO | 2015/003870 A1 | 1/2015 |

OTHER PUBLICATIONS

ISO/IEC, "Identification cards—Contactless integrated circuit cards—Proximity cards—Part 3: Initialization and anticollision," International Standard 14443-3, 3rd ed., Sep. 1, 2016, 70 pages.

ISO/IEC, "Identification cards—Contactless integrated circuit(s) cards—Proximity cards—Part 3: Initialization and anticollision," International Standard 14443-3, 1$^{st}$ ed., Feb. 1, 2001, 58 pages.

\* cited by examiner

METHOD FOR SYNCHRONIZING AN ACTIVE LOAD MODULATION CLOCK WITHIN A TRANSPONDER, AND CORRESPONDING TRANSPONDER

BACKGROUND

Technical Field

The present disclosure relates to wireless communication between a transponder and a reader, such as a high frequency communication between a RFID transponder and a reader operating at 13.56 MHz, RFID transponders using active load modulation (ALM) for communicating with the reader and to the synchronization between the reader carrier clock and the ALM carrier clock.

Description of the Related Art

A transponder may be a passive one, e.g., performing load modulation of the magnetic field generated by the reader.

A transponder may be an active one.

When a transponder is an active one, e.g., using active load modulation (ALM) for transmitting information to the reader, the transponder generates a magnetic field which simulates load modulation of the reading device field performed by a passive transponder.

ALM may be used in case a signal generated by passive load modulation is not strong enough to be detected by an RFID interrogator device or reader. This may be the case when transponder's antenna is small or located in a challenging environment.

ALM systems actively transmit ALM carrier bursts, the frequency of the ALM carrier being the carrier frequency of the reader. This means that each burst of the ALM carrier starts with the same phase difference to the carrier signal emitted by the reader. Unchanged phase also implies that the two frequencies are ideally identical. Maximum phase drift of transponder reply signal comparing to reader carrier signal inside complete transponder reply frame is specified to be 30° in a draft amendment to the ISO/IEC 14443 standard.

Constant phase difference between the ALM carrier and reader carrier can be achieved for example in the following way.

Once the ALM transmission starts (a complete transmission sequence is called a frame and comprises a series of carrier bursts separated by gaps) a frequency source in the transponder is used to generate ALM carrier clock. The frequency source is occasionally corrected during the gaps in the frame when actual carrier bursts are not emitted. During these gaps only the reader carrier signal is present (on the transponder antenna) so the reference frequency is available to re-adjust the ALM carrier frequency source. Such synchronization between the reader carrier frequency and the ALM carrier frequency is performed within each transmitted frame and is called In-Frame Synchronization (IFS).

An example of a device performing an IFS is disclosed in EP 272 7255 B1.

More precisely a phase locked loop (PLL) with a voltage controlled oscillator (VCO), which generates a clock with a frequency equal to a reader carrier frequency, is used to generate the ALM clock. Outside of transponder reply frame, when the carrier clock is constantly available at PLL input, PLL is put in lock mode. In this lock mode, feedback is closed and the PLL is locked to digitized reader carrier signal.

During the transponder reply frame, when ALM transmission takes place, the PLL is put in hold mode.

In the hold mode, PLL feedback is opened and the VCO continues to run with a frequency which was previously established. The free-running frequency of the VCO is defined by a charge which is stored in a loop filter. A frequency difference between the ALM carrier clock generated by the VCO and reader carrier clock results in a phase drift of the ALM carrier clock compared to the reader carrier clock.

This frequency difference is caused by several sources.

A first source is the difference of frequency generated by the PLL system in which the VCO is induced and the input carrier clock at the moment before the PLL is put on hold.

A second source is charge injection of a switch which puts the PLL in hold mode (charge injected by the switch changes the voltage on the VCO control pin, which results in a change of VCO frequency).

A third effect is leakage on the VCO control pin and the loop filter (loop filter input is in high impedance state, a voltage on this input is defined by stored charge, the charge is modified by leakage current of the electronic elements).

The phase drift generated by sources of frequency difference mentioned above has to be corrected before it drifts above the specified maximum. This is done by closing the PLL feedback loop at appropriate moments inside a transponder reply frame, where the ALM transmission does not take place and the clock extracted from the reader carrier signal is restored on the PLL input.

However, ALM carrier bursts produce at the transponder antenna, signal oscillations after each ALM carrier bursts generation. And, such oscillations may disturb the synchronization between the reader carrier frequency and the ALM carrier frequency.

A solution to this problem has been disclosed in WO 2015/003870 A1.

More precisely, in this document, the ALM carrier bursts are generated from a subcarrier modulation by a Binary Phase Shift Keying (BPSK) encoding.

The synchronization is performed in the gap between two transmission bursts. However, due to the higher amplitude during the transmission bursts period and the oscillation properties of the antenna, the signal amplitude on the antenna of the transponder decays slowly without application of specific measures. And, without such specific measures, the decay of the signal on the inductive capacity antenna lasts too long and does not allow enough time for resynchronization.

Accordingly, the solution disclosed in WO 2015/003870 A1 to shorten this decay comprises performing a controlled damping of the oscillation by specific damping means which quickly stops the oscillation built by ALM transmission.

However, such a damping system increases complexity of the ALM transponder.

The European patent application filed under number 17169020, proposed to perform said in-frame synchronization of transponder when some phase change of BPSK code takes place, without performing any controlled damping through a dedicated damping system.

BRIEF SUMMARY

In an embodiment, a method comprises: generating an active load modulation (ALM) carrier clock of a transponder synchronized to a carrier clock of a reader using a digital phase locked loop (DPLL); and transmitting data frames from the transponder to the reader using the ALM carrier clock, the generating the ALM carrier clock including: between transmission of data frames, placing said DPLL in a lock mode of operation in which a feedback loop is closed; and within a transmitted data frame having a duration, placing, for the duration of the transmitted data frame, said DPLL in a hold mode of operation in which the feedback loop is opened; and adjusting a phase of said ALM carrier clock at least one time during the duration of the transmitted data frame. In an embodiment, the method comprises adjusting the phase of said ALM carrier clock several times within each transmitted data frame. In an embodiment, the method comprises: generating, using a digitally controlled oscillator having an oscillator frequency equal to N times a frequency of the carrier clock of the reader, an oscillator signal; and dividing, using a divider, the oscillator signal by N. In an embodiment, adjusting the phase of the ALM carrier clock comprises controlling a parameter of the divider. In an embodiment, said divider comprises a counter performing said division by N and outputting said ALM carrier clock, and controlling a parameter of said divider comprises resetting the counter to a determined value based on a previous phase shift between the carrier clock of the reader and the ALM carrier clock of the DPLL in lock mode. In an embodiment, said divider comprises a counter performing said division by N and configured to deliver a plurality of output signals having different phases, wherein adjusting the phase of said ALM carrier clock comprises selecting an output signal of the plurality of output signals having a phase which is closest to a previous phase shift between the carrier clock of the reader and the ALM carrier clock of the DPLL in lock mode. In an embodiment, the DPLL comprises a digitally controlled oscillator and the method includes adjusting a frequency of said digitally controlled oscillator based on an adjustment to the phase of said ALM carrier clock. In an embodiment, the method comprises adjusting a frequency of the digitally controlled oscillator based on a difference between the determined value and an actual value of the counter when the counter is reset to said determined value.

In an embodiment, a device comprises: a digital phase locked loop (DPLL), which, in operation, generates an active load modulation (ALM) carrier clock synchronized to a carrier clock of a reader; and transmission circuitry, which, in operation, transmits data frames to the reader using the ALM carrier clock, wherein the generating the ALM carrier clock includes: between transmission of data frames, placing said DPLL in a lock mode of operation in which a feedback loop of the DPLL is closed; and within a transmitted data frame having a duration, placing, for the duration of the transmitted data frame, said DPLL in a hold mode of operation in which the feedback loop is opened; and adjusting a phase of said ALM carrier clock at least once during the duration of the transmitted data frame. In an embodiment, adjusting the phase of said ALM carrier clock at least once during the duration comprises adjusting the ALM carrier clock a plurality of times within each transmitted data frame. In an embodiment, the DPLL comprises: a digitally controlled oscillator having an oscillator frequency equal to N times a frequency of the carrier clock of the reader, which, in operation, generates an oscillator signal; and a divider, which, in operation, divides the oscillator signal by N. In an embodiment, adjusting the phase of the ALM carrier clock comprises controlling a parameter of the divider. In an embodiment, said divider comprises a counter, which, in operation, performs said division by N and outputs said ALM carrier clock, and controlling a parameter of said divider comprises resetting the counter to a determined value based on a previous phase shift between the carrier clock of the reader and the ALM carrier clock of the DPLL in lock mode. In an embodiment, said divider comprises a counter, which, in operation, performs said division by N and generates a plurality of output signals having different phases, and adjusting the phase of said ALM carrier clock comprises selecting an output signal of the plurality of output signals having a phase which is closest to a previous phase shift between the carrier clock of the reader and the ALM carrier clock of the DPLL in lock mode. In an embodiment, the DPLL comprises a digitally controlled oscillator and the DPLL, in operation, adjusts a frequency of said digitally controlled oscillator based on an adjustment to the phase of said ALM carrier clock. In an embodiment, the DPLL, in operation, adjusts a frequency of the digitally controlled oscillator based on a difference between the determined value and an actual value of the counter when the counter is reset to said determined value. In an embodiment, the transmission circuitry, in operation, transmits near field communication protocol signals.

In an embodiment, a system comprises: a tag reader, which, in operation, transmits a reader carrier clock; and a tag including: a digital phase locked loop (DPLL), which, in operation, generates an active load modulation (ALM) carrier clock synchronized to the reader carrier clock; and transmission circuitry, which, in operation, transmits data frames to the reader using the ALM carrier clock, wherein the generating the ALM carrier clock includes: between transmission of data frames, placing said DPLL in a lock mode of operation in which a feedback loop of the DPLL is closed; and within a transmitted data frame having a duration, placing, for the duration of the transmitted data frame, said DPLL in a hold mode of operation in which the feedback loop is opened; and adjusting a phase of said ALM carrier clock at least once during the duration of the transmitted data frame. In an embodiment, the DPLL comprises: a digitally controlled oscillator having an oscillator frequency equal to N times a frequency of the carrier clock of the reader, which, in operation, generates an oscillator signal; and a divider, which, in operation, divides the oscillator signal by N. In an embodiment, the transmission circuitry, in operation, transmits near field communication protocol signals to the reader.

According to an embodiment, in-frame synchronization of a transponder is performed by aligning the oscillator frequency of a digitally phase locked loop (DPLL) outside of transponder reply frames to the frequency of the reader carrier clock and, inside transponder reply frames, keeping the oscillator frequency and occasionally correcting a phase of the generated ALM carrier clock in order to keep variation of phase difference of those two clocks inside a target range.

In other words, in an embodiment an IFS synchronization is still performed but with a phase adjustment while keeping the DPLL in its hold mode.

The phase correction may depend on the used communication protocol. For example, as indicated above, maximum phase drift of transponder reply signal comparing to reader carrier signal inside a complete transponder reply frame is specified to be 30° in draft amendment to ISO/IEC 14443 standard.

In an embodiment, a method of wireless communication from a transponder to a reader using active load modulation, called ALM, comprises transmission of data frames from the transponder to the reader and synchronization between a reader carrier clock and an ALM carrier clock generated from a digital phase locked loop (DPLL) receiving said reader carrier clock.

In an embodiment, said synchronization comprises outside of each transmitted frame, placing said digital phase locked loop in a lock mode in which the feedback loop of the digital phase locked loop is closed, and within each transmitted frame, placing said digital phase locked loop in an hold mode in which said feedback loop is opened and correcting the phase of said ALM carrier clock at least one time in order to keep the variation of phase difference between said ALM carrier clock and said reader clock inside a target range.

Thus in an embodiment, DPLL only runs outside of transponder reply frame, which means that loop filter characteristic only has to be optimized for this case. Phase adjustment can also be done by a single pulse of restored reader carrier signal, which means that damping system can be simplified or it may in some cases not be needed at all.

Although it would be theoretically possible to correct the phase of said ALM carrier clock only one time within each transmitted frame, leading thus to the use of a very precise digitally controlled oscillator, it may be desirable in an embodiment to avoid this precision constraint to correct the phase occasionally but several times within each transmitted frame (e.g., periodically). This facilitates using a conventional digitally controlled oscillator without any particular requirements related to its precision.

For example the phase correction may be performed between some of the transmitted bursts, eventually between each transmitted burst, of the reply frame, or when some phase change of BPSK code takes place, for example when the phase of BPSK signal changes so that the subcarrier half-periods where there is no transmission are attached.

According to an embodiment, said digital phase locked loop comprises a digitally controlled oscillator having an oscillator frequency equal to N times the frequency of the reader carrier clock and generating an oscillator signal to a divider performing division by N for outputting said ALM carrier clock; and correcting the phase of said ALM carrier clock comprises controlling a parameter of said divider.

In an embodiment, said divider comprises a counter performing said division by N for outputting said ALM carrier clock, controlling a parameter of said divider comprises for example resetting the counter to a presetting value corresponding to a phase shift between the reader carrier clock and the outputted ALM carrier clock when the digital phase locked loop is in its lock mode.

In an embodiment, said divider comprises a counter (for example a Johnson counter) performing said division by N and configured to deliver several output signals having different phases, correcting the phase of said ALM carrier clock comprises for example selecting the output signal having a phase which is the closest of a desired phase corresponding to a phase shift between the reader carrier clock and the outputted ALM carrier clock when the digital phase locked loop is in its lock mode.

According to an embodiment, when said digital phase locked loop including a digitally controlled oscillator having an oscillator frequency, is in its hold mode, the method may comprise correcting the frequency of said digitally controlled oscillator from the phase correction of said ALM carrier clock.

In an embodiment, correcting the frequency of the digitally controlled oscillator may for example comprise determining the difference between the presetting value and the actual value of the counter when the counter is reset to said presetting value, determining from said difference a frequency difference, and using said frequency difference for correcting the frequency of said digitally controlled oscillator.

In an embodiment, a transponder is proposed, configured to wireless communicate towards a reader using active load modulation, called ALM, said transponder comprising transmission means configured to transmit frames to the reader through an antenna, synchronization means comprising a digital phase locked loop adapted to receive said reader carrier clock and to generate an ALM carrier clock, first correction means configured to correct the phase of said ALM carrier clock in order to keep the variation of phase difference between said ALM carrier clock and said reader carrier clock inside a target range, and control means configured outside of each transmitted frame, to place said digital phase locked loop in a lock mode in which the feedback loop is closed, and within each transmitted frame, to place said digital phase locked loop in an hold mode in which the feedback loop is opened and to activate said first correction means at least one time.

In an embodiment, said control means are configured to activate said first correction means several times within each transmitted frame.

According to an embodiment, said digital phase locked loop comprises a digitally controlled oscillator having an oscillator frequency equal to N times the frequency of the reader carrier clock and configured to generate an oscillator signal to a divider configured to perform division by N for outputting said ALM carrier clock, and said first correction means are configured to correct the phase of said ALM carrier clock by controlling a parameter of said divider.

According to an embodiment, said divider comprises a counter configured to perform said division by N for outputting said ALM carrier clock, and said first correction means are configured to control a parameter of said divider by resetting the counter to a presetting value corresponding to a phase shift between the reader carrier clock and the outputted ALM carrier clock when the digital phase locked loop is in its lock mode.

According to an embodiment, said divider comprises a counter configured to perform said division by N and to deliver several output signals having different phases, and said first correction means are configured to correct the phase of said ALM carrier clock by selecting the output signal having a phase which is the closest of a desired phase corresponding to a phase shift between the reader carrier clock and the outputted ALM carrier clock when the digital phase locked loop is in its lock mode.

According to an embodiment, said digital phase locked loop includes a digitally controlled oscillator having an oscillator frequency, and said transponder further comprises second correction means configured to correct the frequency of said digitally controlled oscillator from the phase correction of said ALM carrier clock, when said digital locked loop is in its hold mode.

According to an embodiment, said second correction means comprises determination means configured to determine the difference between the presetting value and the actual value of the counter when the counter is reset to said presetting value, and to determine from said difference a frequency difference, and said second correction means are configured to use said frequency difference for correcting the frequency of said digitally controlled oscillator.

According to an embodiment, the transponder is configured to wireless communicate towards said reader according to a NFC protocol, for example according to ISO/IEC 14443 type B protocol.

DETAILED DESCRIPTION

In the following description, certain details are set forth in order to provide a thorough understanding of various embodiments of devices, systems, methods and articles. However, one of skill in the art will understand that other embodiments may be practiced without these details. In other instances, well-known structures and methods associated with, for example, circuits, such as transistors, multipliers, adders, dividers, comparators, integrated circuits, logic gates, finite state machines, RFID tags, RFID readers, antennas, memories, bus systems, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure.

The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn are not necessarily intended to convey any information regarding the actual shape of particular elements, and have been selected solely for ease of recognition in the drawings.

Figure 1:
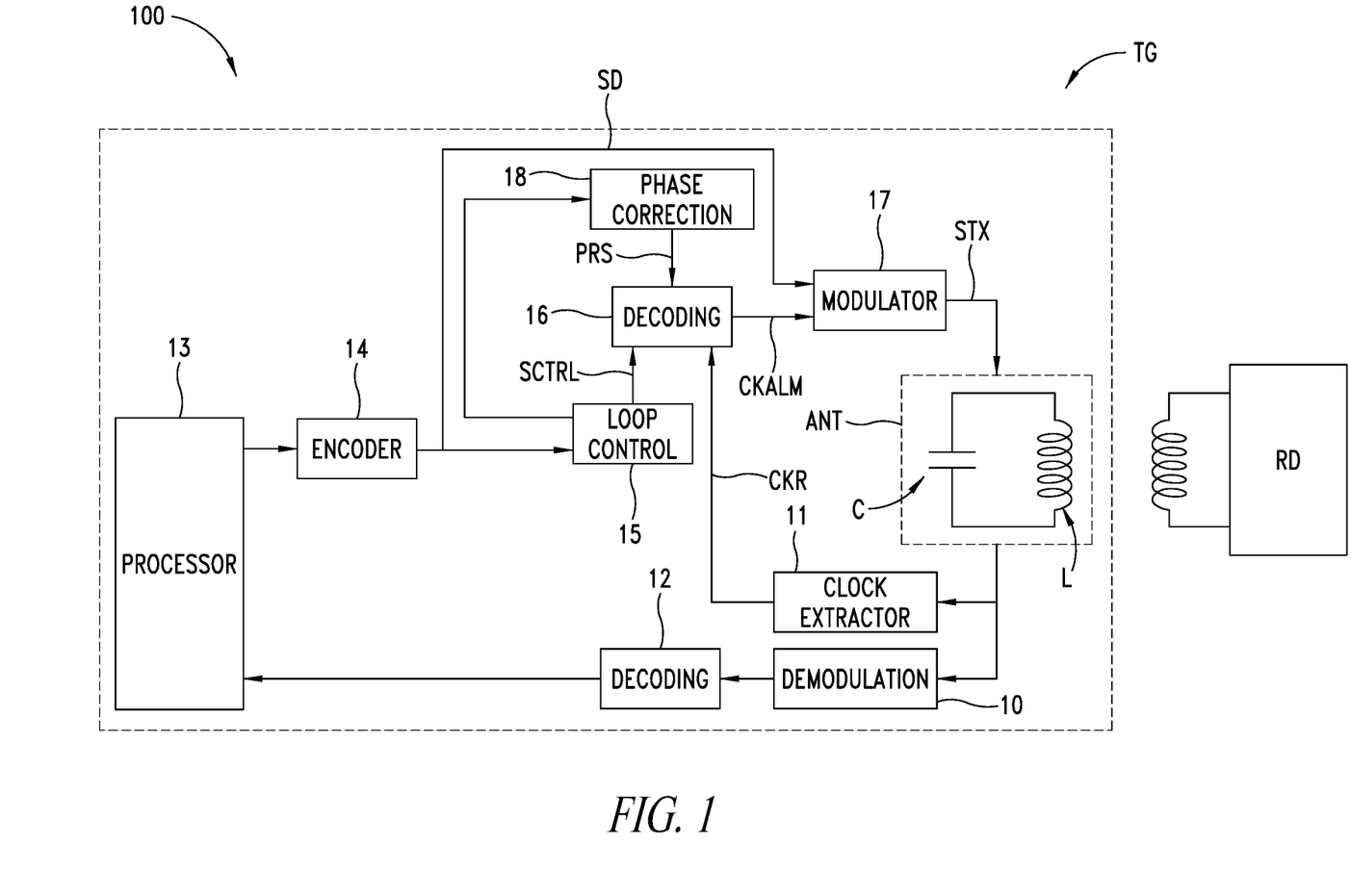
FIG. 1 is a functional block diagram of an embodiment of a system including a transponder and a reader.

On FIG. 1, which is a functional block diagram of a system 100, reference TG designates a transponder or tag configured to wireless communicate towards a reader RD reading active load modulation ALM according for example to ISO/IEC 14443 type B protocol.

The transponder TG comprises transmission means (e.g., circuitry) configured to transmit frames including ALM carrier bursts to the reader RD through an antenna ANT.

Said antenna comprises an inductive element L as well as one or several capacitors C.

The transponder comprises a demodulation circuit 10 coupled to a decoding circuit 12 for receiving data from the reader RD through antenna ANT.

The decoding circuit 12 provides data to a processing unit or circuit 13, for example a processor, a processing core, etc., which provides also data to be sent to the reader.

The data may be for example application data of a NFC (Near Field Communication) application such as transaction, payment, etc.

A circuit 11 extracts a clock CKR having a frequency equal to the reader carrier frequency fc, which is for example equal to 13.56 MHz in ISO/IEC 14443. The clock CKR is called reader carrier clock.

The transmission means comprises encoding means (e.g., an encoder circuit) 14 configured to perform here a Binary Phase Shift Keying (BPSK) data encoding.

The encoding means 14 provides to modulating means (e.g., a modulator circuit) 17 (e.g., belonging to the transmission means) a data modulating signal SD using a subcarrier (here a 847.5 KHz subcarrier).

Figure 2:
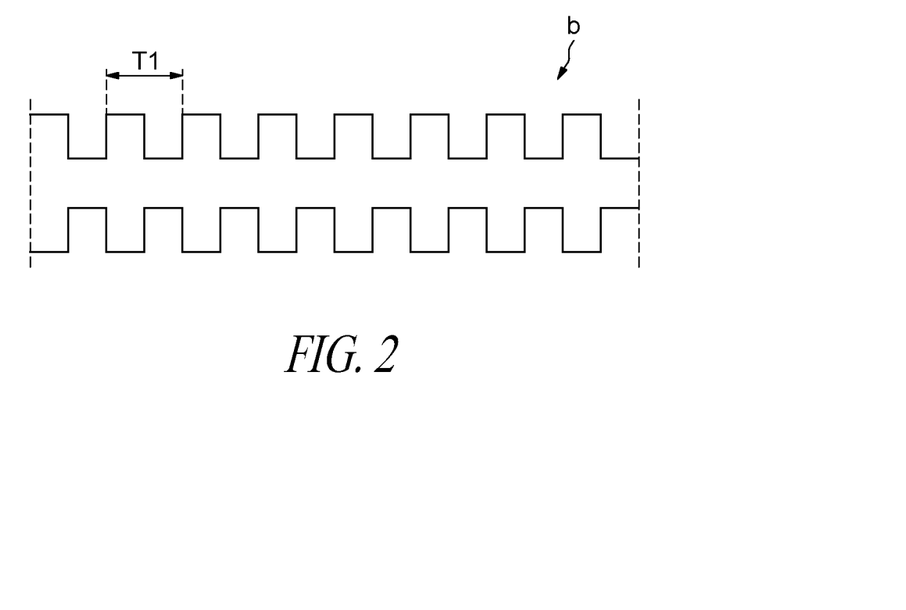
FIG. 2 illustrates an example bit period of an ISO/IEC 14443 type B bit.

As illustrated in FIG. 2, one bit period of a bit b to be transmitted contains 8 subcarrier periods T1, which corresponds for example to ISO/IEC 14443 type B 106 kbps. In other words 8 subcarrier periods are used for a bit rate of 106 kbps (fc/128). At higher bit rates the number of subcarrier period is lower.

The logical value of the bit b depends on the state high or low of the beginning of the bit period. For example, a bit period beginning with a high state and finishing with a low state may be considered as being a logical "1" whereas a bit period beginning with a low state and finishing with a high state may be considered as being a logical "0." Of course, this convention could be inverted.

Figure 3:
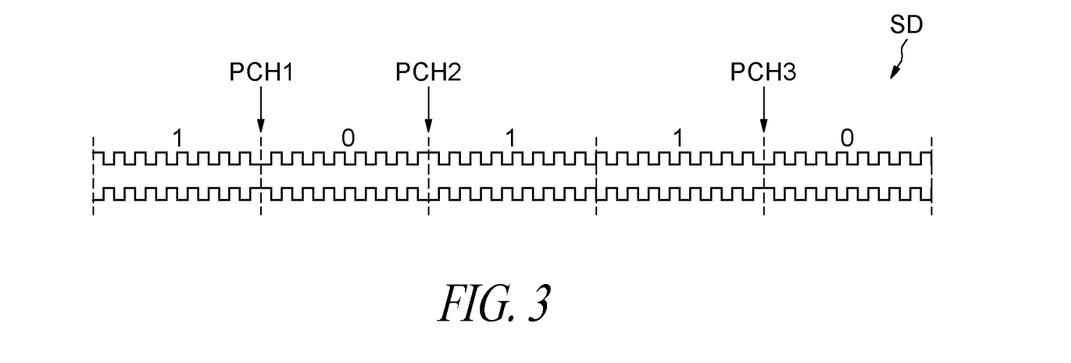
FIG. 3 illustrates an example of a series of bits 1, 0, 1, 0 contained in a data signal.

FIG. 3 illustrates an example of a series of bits 1, 0, 1, 0 contained in a data signal SD.

Figure 4:
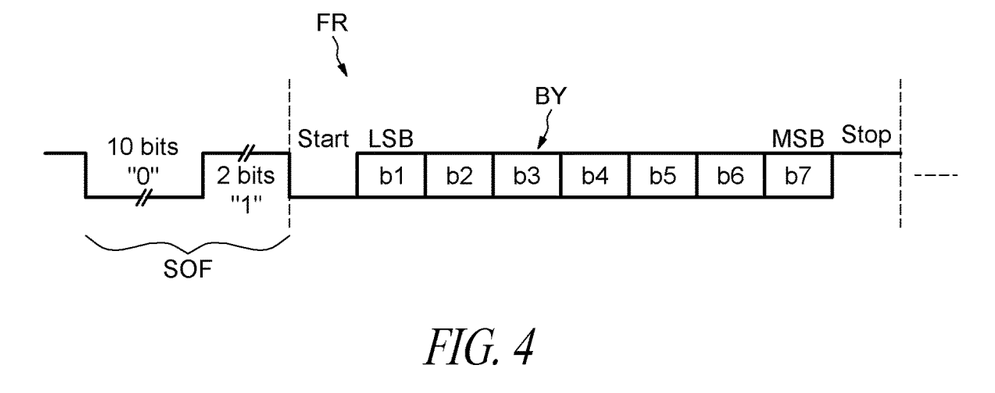
FIG. 4 illustrates an example of a byte of data of a data frame.

Data communication between the card or tag and reader is performed using an LSB-first data format. Each byte BY of data is transmitted with a "0" start bit and a "1" stop bit as shown in FIG. 4. The stop bit, start bit, and each data bit are one elementary time unit (ETU) in length (9.439 μS). ISO/IEC 14443 defines a character (a byte) as comprising a start bit, eight data bits (LSB-first, MSB-last), and a stop bit.

Further each frame FR comprises before the first data byte BY, a so called Start of Frame (SOF) including at least 10 bits "0" and 2 bits "1."

The modulation means 17 receive the modulating data signal SD as well as an ALM clock, called ALM carrier clock, CKALM advantageously provided by a digital phase locked loop (DPLL) circuit 16. The modulation means 17 are configured to perform a subcarrier modulation with said data encoding for generating a signal STX to antenna ANT.

Figure 5:
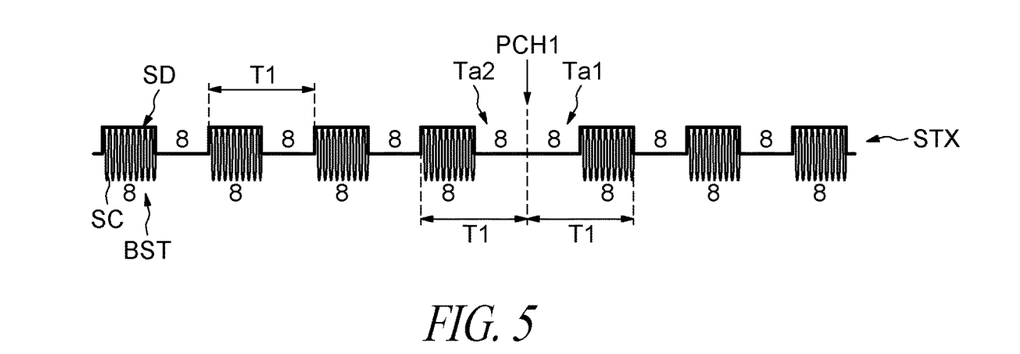
FIG. 5 illustrates example bursts of an ALM carrier signal.

This signal STX comprises, as illustrated in FIG. 5, bursts BST of ALM carrier SC (said ALM carrier SC having a frequency equal here to 13.56 MHz).

Two consecutive bursts BST are separated by a gap wherein no signal is transmitted from the transponder to the reader.

Each half period of the subcarrier period T1 during which there is a signal transmission contains 8 periods of the carrier signal SC.

Figure 6:
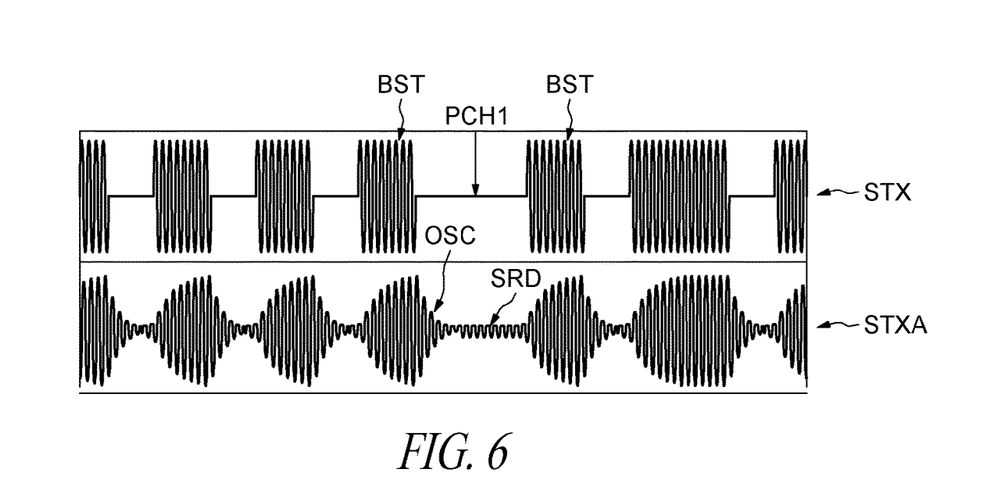
FIG. 6 illustrates an example burst signal and a corresponding signal STXA at an antenna.

The signal STX and the corresponding signal STXA at the antenna are illustrated in FIG. 6.

As illustrated in this FIG. 6, each generation of ALM carrier burst BST produces after said generation, signal oscillation OSC at the antenna which can decay due to specific damping means, if any, or which can naturally decrease if for example the quality factor of the antenna is moderate, for example smaller than or equal to 8 as disclosed for example in European patent application n° 17169020 mentioned above.

On FIG. 6, the signal SRD present at the antenna corresponds to the reader carrier signal present on transponder antenna.

If we refer now again to FIG. 3, it appears that some phase changes PCH1, PCH2, PCH3 may occur during frame transmission.

Each phase change occurs when two consecutive bits having two different logical values are transmitted.

Depending on the transition 1 to 0 or 0 to 1 between two bits, the phase change may occur during a gap where there is no signal transmission from the transponder as for example phase changes PCH1 and PCH3 or during a period where there is signal transmission as for example phase change PCH2.

In other words, as illustrated on FIG. 5, a phase change like a phase change PCH1 occurs when no burst is generated during the half period Ta2 of the sub carrier preceding the phase change PCH1 and the half period Ta1 following this phase change.

Turning now again to FIG. 1, synchronization means configured to perform synchronization between the reader carrier clock CKR and the ALM carrier clock CKALM comprises the digital phase locked loop (DPLL) 16 adapted to receive the reader carrier clock CKR and to generate the ALM carrier clock CKLM.

The transponder further comprises first correction means or phase correction circuitry 18 configured to deliver a correction signal, for example a presetting value PRS to the DPLL to correct the phase of the ALM carrier clock CKALM in order to keep the variation of phase difference between the ALM carrier clock CKLM and the reader carrier clock CKR inside a target range.

The transponder further comprises control means or loop control circuit 15 configured to deliver a control signal SCTRL to place outside of each transmitted frame FR, said digital phase locked loop 16 in a lock mode in which the feedback loop is closed and to place within each transmitted frame FR said digital phase locked loop in an hold mode in which the feedback loop is opened and to activate the first correction means at least one time within each transmitted frame. In an embodiment, two control signals may be employed (e.g., a control signal to control application of feedback and a control signal to activate phase correction).

The control means 15 may be implemented as a software module or by a logic circuit.

When the control signal SCTRL has a first logical value, the DPLL 16 is put in a hold mode in which the feedback loop is opened, inside each transmitted frame.

And, outside each transmitted frame, the control signal STRL has a second logical value, in response of which the DPLL 16 is put in a lock mode closing the feedback loop for performing frequency synchronization between clocks CKR and CKALM.

Figure 7:
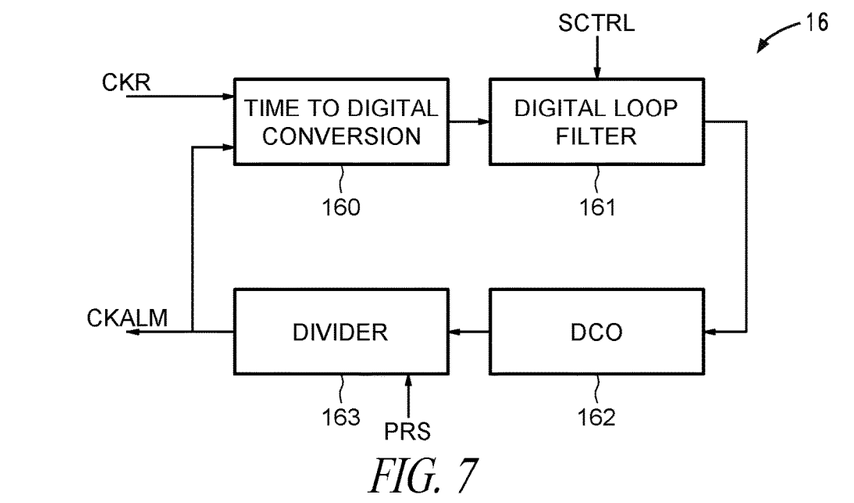
FIG. 7 is a functional block diagram of an embodiment of a digital phase-locked-loop.

As illustrated in FIG. 7, the DPLL 16 comprises a time to digital converter based phase frequency detector 160 followed by a digital loop filter 161 followed by a digitally controlled oscillator (DCO) 162 followed by a feedback loop including a divider 163. The output of the divider is connected to the second entry of the time to digital converter based phase frequency detector 160.

Efficient implementation (small in size) may include running of DCO at high frequency (few hundred MHz or higher). It is the reason why the divider block is here provided to generate the ALM carrier clock CKALM to be in phase with the reader carrier clock (having a frequency equal here to 13.56 MHz).

The first input of the time to digital converter based phase frequency detector 160 receives the clock CKR extracted from the reader carrier signal.

The DCO is controlled by a DCO control word delivered by the digital loop filter 161.

When, in response to the control signal SCTRL, the DPLL is put in hold mode, the feedback loop is opened and the last DCO control word before opening the loop, is stored and used to control the DCO in the hold mode.

As the DCO control is digital, the only source of frequency difference in system using DCO is difference of frequency generated by PLL system in which DCO is induced and the input carrier signal at the moment before the PLL is put on hold. DCO frequency at given control word value only drifts in case supply voltage or temperature change. These changes are negligible in time period which corresponds to duration of transponder reply (few tens of ms).

Therefore, it can be supposed that the DCO frequency does not vary inside a transponder reply frame FR. As the DCO frequency does not change inside the transponder reply frame, it is thus not necessary to lock the DPLL 16 inside the transponder reply frame FR to correct the frequency. It is thus sufficient to only correct the phase of the ALM clock CKALM.

In other words, DPLL only runs outside of transponder reply frame, which means that loop filter characteristic only has to be optimized for this case. Phase adjustment can also be done theoretically at least one time within the frame FR. Thus, specific damping system can be simplified or it may be in some cases not be needed at all.

Practically, in order to avoid to implement a too precise DCO, an embodiment may adjust the phase several times within each transmitted frame FR.

For example, a phase adjustment may be performed between each burst BST or at each phase changes of the PCH1 or PCH3 type (FIG. 3) or, at each phase change PCH1.

According to the embodiment disclosed on FIG. 7, the divider 163 is provided with a new input which is adapted to receive the presetting value PRS in order to reset the state of the divider to this presetting value.

As the generated ALM clock is not exactly the same as reader carrier clock, the phase difference between the two signals drifts in time. In order to keep phase drift inside the specified limits, the phase is corrected by presetting the divider at least one time inside each transmitted frame FR. Granularity of such phase adjustment is defined by ratio between DCO frequency and reader carrier frequency. To simplify the divider this ratio may be set to be an integer value. This defines granularity of phase adjustment to be 360°/n. This granularity is an additional contribution to phase variation and has to be taken in account. If for example the DCO frequency is set to 64 times transponder carrier frequency, one divider count corresponds to 360°/64 (5.625°), which is also granularity of phase adjustment system. This is variation of phase due to granularity of phase adjustment system.

To resume, the DPLL 16 operates in the following way:
DPLL only runs outside of transponder reply frame where the reader carrier clock is always present on DPLL input. Before start of transponder reply frame the DPLL feedback loop is put on hold, the value of DCO control word on output of digital loop filter is stored and used to define DCO frequency during complete transponder reply frame. Inside transponder reply frame the phase of generated ALM clock CKALM is occasionally corrected by resetting the divider with the presetting value PRS.

Figure 8:
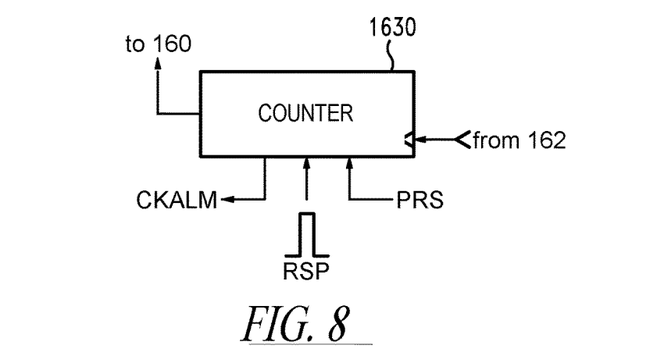
FIG. 8 is a functional block diagram of an embodiment of a counter of a digital phase-locked-loop.

According to an embodiment illustrated in FIG. 8, the divider 163 comprises a counter 1630 configured to receive the oscillator signal outputted by the DCO and to perform division by N (here N=64) for outputting said ALM carrier clock CKALM.

Generally speaking the first correction means 18 are configured to control a parameter of said divider, here by resetting the counter 1630 to the presetting value PRS, in presence of a reset pulse RSP.

Figure 9:
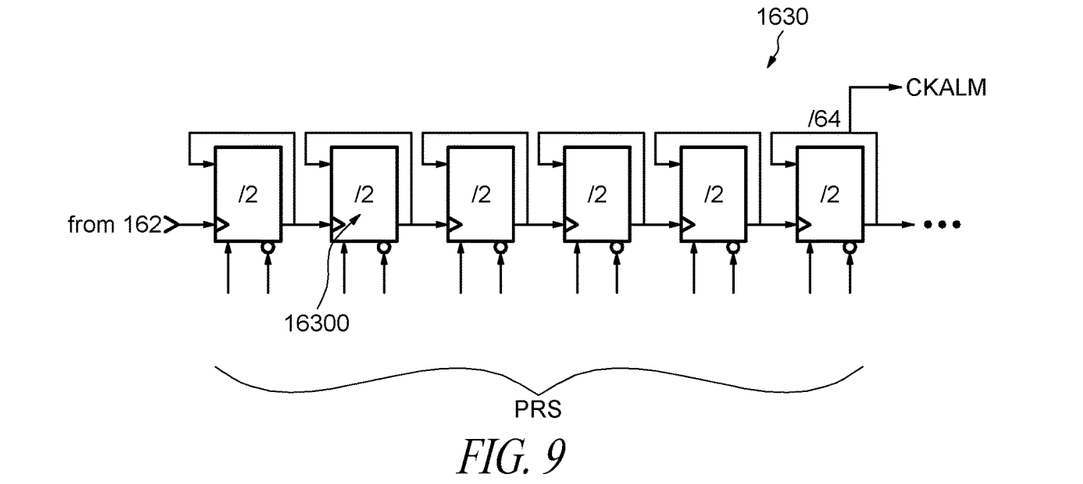
FIG. 9 is a functional block diagram of an embodiment of a counter of a digital phase-locked-loop.

As illustrated in FIG. 9, the counter 1630 comprises several flip-flops, the last flip-flop delivering the clock CKALM.

And, the presetting value PRS is here a digital word, stored for example in a register of said first correction means, adapted to reset the several flip-flops in order to give to the counter 1630 said presetting value.

Generally speaking, the presetting value corresponds to a phase shift between the reader carrier clock CKR and the outputted ALM clock CKLALM when the digital phase locked loop 16 is in its locked mode.

Figure 10:
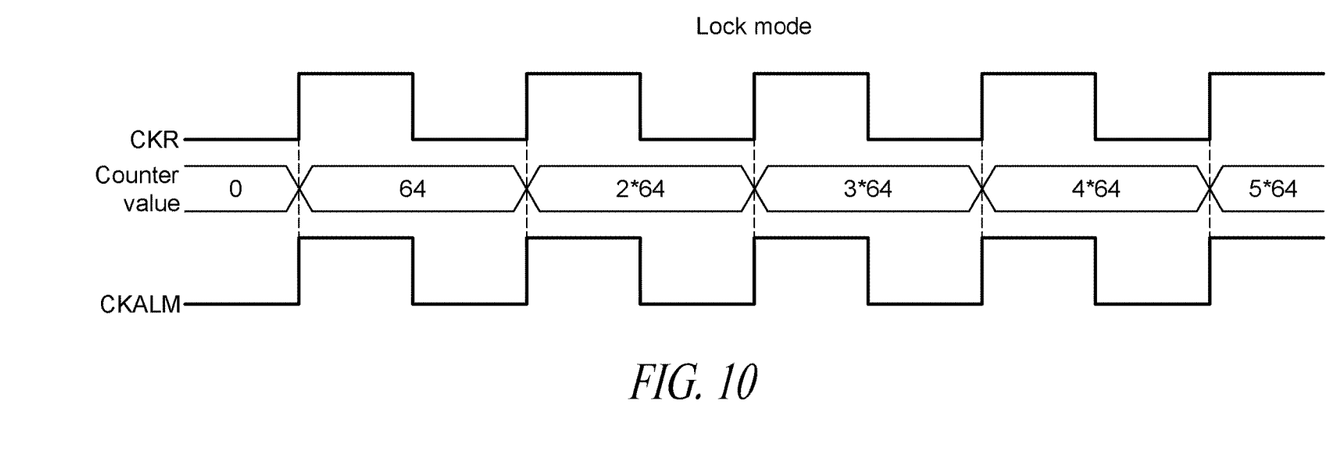
FIGS. 10 and 11 are timing diagrams illustrating an embodiment of resetting a counter.
Figure 11:
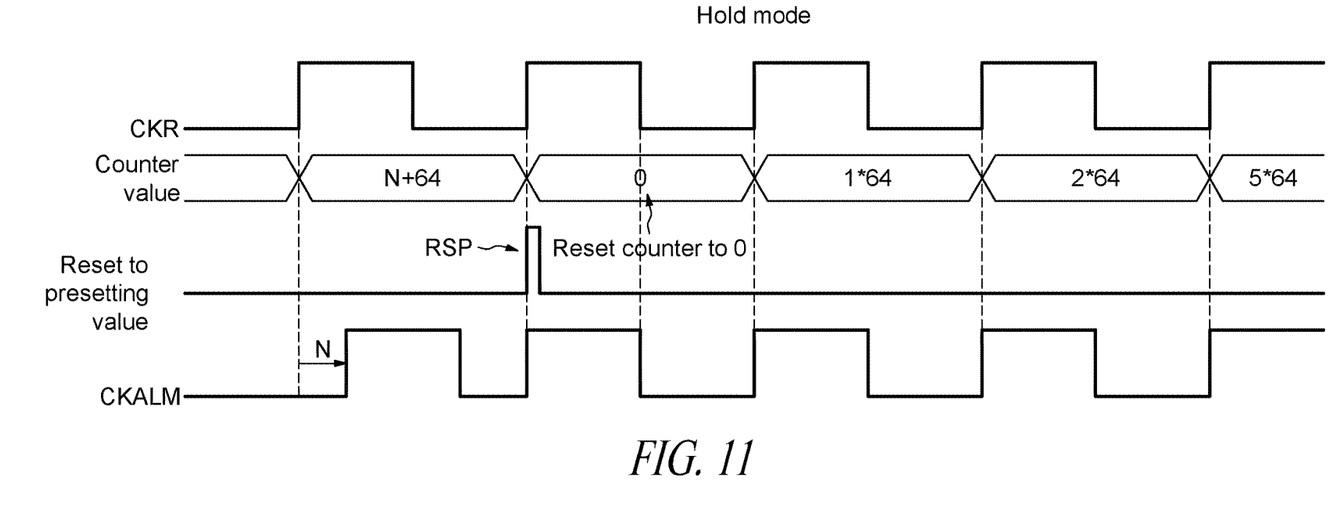

More precisely, FIGS. 10 and 11 illustrate a first example of resetting the counter 1630 with a presetting value.

FIG. 10 illustrates diagrammatically the temporal evolutions of the clock CKR, the clock CKALM and the counter values of the counter 1630 when the DPLL is in its locked mode and when there is no phase shift between the signals CKR and CKALM in the locked mode.

FIG. 11 illustrates the temporal evolutions of the same signals CKR and CKALM as well as the counter values when the DPLL is in its hold mode.

In this example, at one time, the phase difference between the two signals CKR and CKALM is equal to N periods of the digitally controlled oscillator. Thus, when the counter is reset in response to the reset pulse RSP, the presetting value is equal to 0 because in this embodiment, there is no phase shift between the clock CKR and the clock CKALM in the locked mode of the DPLL.

After this phase adjustment, the signal CKALM and the signal CKR are again aligned and IFS synchronization has been performed.

Figure 12:
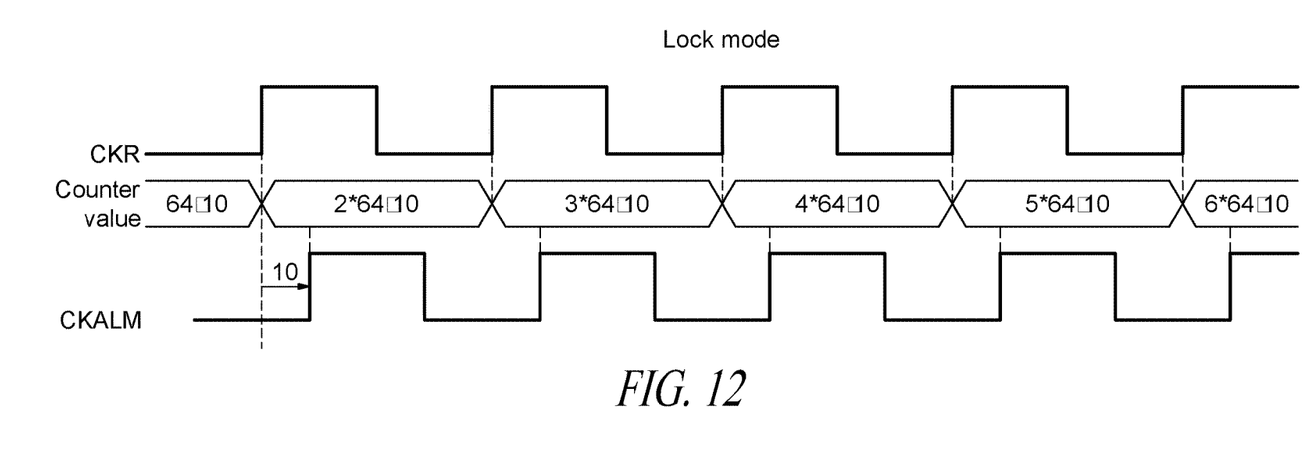
FIGS. 12 and 13 are timing diagrams illustrating an embodiment of resetting a counter.
Figure 13:
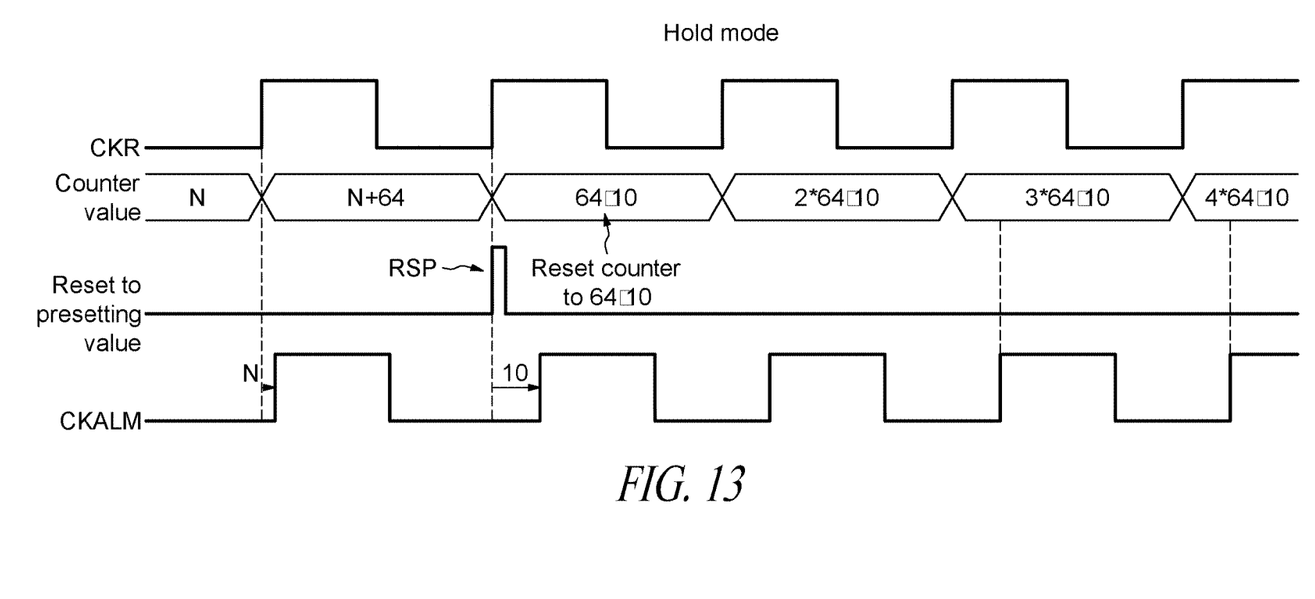

FIGS. 12 and 13 illustrate the case where there is a phase shift of 10 periods of the oscillator signal delivered by the digitally controlled oscillator between the clock CKR and the clock CKALM in the lock mode of the DPLL 16.

Thus, as illustrated in FIG. 13, when the DPLL is in its hold mode, the counter is reset to the presetting value equal to 64-10 in response to the reset pulse RSP in order to obtain again a phase shift of 10 periods of the oscillator signal between clock CKR and clock CKALM.

Figure 14:
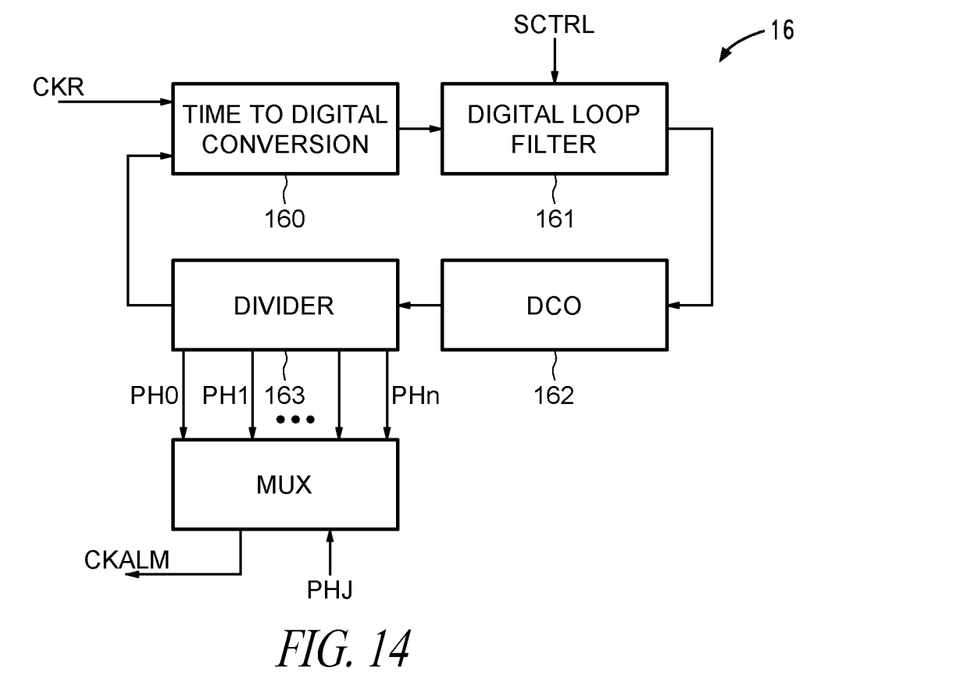
FIG. 14 is a functional block diagram of an embodiment of a divider of a digital phase-locked-loop.

In the embodiment disclosed in FIG. 14, the divider 163 comprises a Johnson counter configured to perform division by N (here division by 64) and to deliver several output signals having different phases PH0-PHn.

And, the first correction means or phase correction circuit 18 are configured to correct the phase of the ALM carrier clock CKALM by selecting the output signal having a phase which is the closest of a desired phase corresponding to the phase shift between the reader carrier clock and the outputted ALM clock when the DPLL is in its lock mode.

More precisely, in this example, if we assume that we had a phase shift between the signal CKR and CKALM equal to 10 periods of the oscillator signal when the DPLL was in its lock mode, the first correction means will send an adjustment signal PHJ in order to select the tenth phase PH9.

By adding a digital processing block it is additionally possible to reduce the difference between generated ALM clock and reader carrier clock frequencies inside a transmitted frame FR without locking the DPLL loop. This can be done by observing the difference between the divider presetting value and the actual state of divider at the moment where the reset pulse is emitted (e.g., at the moment where the reset is done with the presetting value). This difference provides information about the phase error which was accumulated in time period between two synchronization time points from which difference of the two frequencies can be calculated. Information about calculated frequency difference can be then used to correct the DCO frequency.

Figure 15:
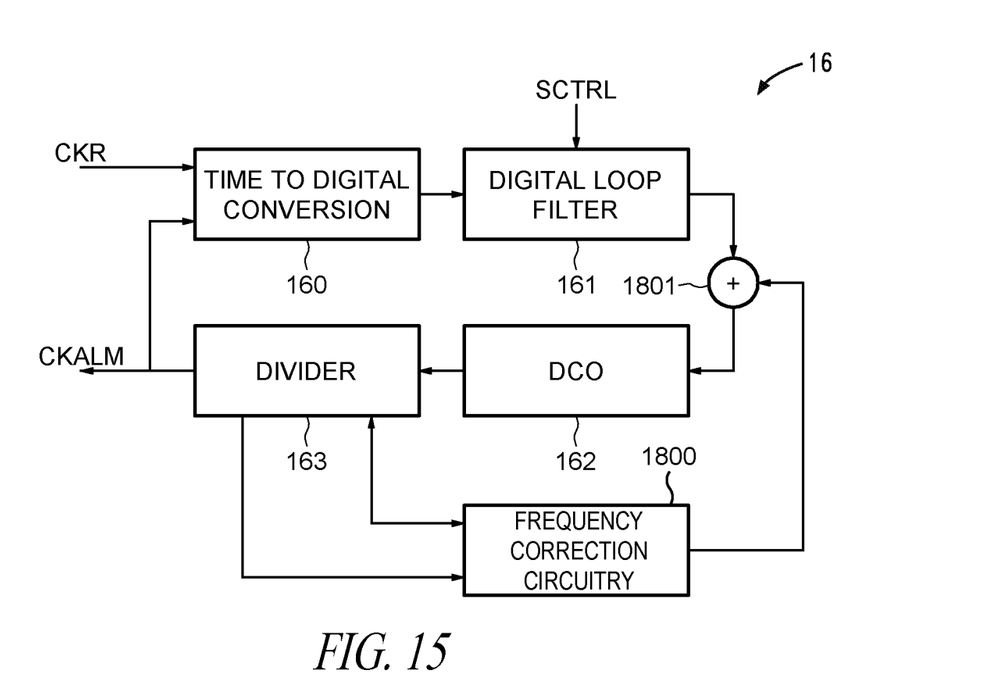
FIG. 15 is a functional block diagram of an embodiment of a divider of a digital phase-locked-loop.

FIG. 15 depicts system shown on FIG. 7 to which possibility to correct DCO frequency inside transmitted frame FR was added.

Second correction means are provided comprising determination means or frequency correction circuitry 1800 configured to determine the difference between the presetting value PRS and the actual value of the counter when the counter is reset to said resetting value, and to determine from said difference a frequency difference.

Said second correction means are configured to use said frequency difference for correcting the frequency of the digitally controlled oscillator 162.

As illustrated, an adder 1801 is provided for adding the frequency difference to DCO control word which is output from digital loop filter 161.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
generating an active load modulation (ALM) carrier clock of a transponder synchronized to a carrier clock of a reader using a digital phase locked loop (DPLL), the DPLL having a frequency which is a multiple N of a frequency of the carrier clock of the reader, where N is an integer value; and
transmitting, using a near field communication protocol, data frames from the transponder to the reader using the ALM carrier clock, the generating the ALM carrier clock including:
between transmission of data frames, placing said DPLL in a lock mode of operation in which a feedback loop is closed; and
within a transmitted data frame having a duration,
placing, for the duration of the transmitted data frame, said DPLL in a hold mode of operation in which the feedback loop is opened; and
adjusting a phase of said ALM carrier clock at least one time during the duration of the transmitted data frame.

2. The method according to claim 1, comprising adjusting the phase of said ALM carrier clock several times within each transmitted data frame.

3. The method according to claim 1, comprising:
generating, using a digitally controlled oscillator having an oscillator frequency which is the multiple N times the frequency of the carrier clock of the reader, an oscillator signal; and
dividing, using a divider, the oscillator signal by the multiple N.

4. The method according to claim 1, wherein the DPLL comprises a digitally controlled oscillator and the method includes adjusting a frequency of said digitally controlled oscillator based on an adjustment to the phase of said ALM carrier clock.

5. A device, comprising:
means for generating an active load modulation (ALM) carrier clock synchronized to a carrier clock of a reader, the means having a frequency which is a multiple N of a frequency of the carrier clock of the reader, where N is an integer value; and
means for transmitting data frames to the reader using the ALM carrier clock, wherein the generating the ALM carrier clock includes:
between transmission of data frames, placing the means for generating in a lock mode of operation in which a feedback loop of the means for generating is closed; and
within a transmitted data frame having a duration,
placing, for the duration of the transmitted data frame, the means for generating in a hold mode of operation in which the feedback loop is opened; and
adjusting a phase of said ALM carrier clock at least once during the duration of the transmitted data frame.

6. The device of claim 5 wherein adjusting the phase of said ALM carrier clock at least once during the duration comprises adjusting the ALM carrier clock a plurality of times within each transmitted data frame.

7. The device of claim 5 wherein the means for generating comprises:
digitally controlled oscillating means having an oscillator frequency which is the multiple N times the frequency of the carrier clock of the reader, wherein the digitally controlled oscillating means, in operation, generates an oscillator signal; and
means for dividing the oscillator signal by the multiple N.

8. The device of claim 7 wherein adjusting the phase of the ALM carrier clock comprises controlling a parameter of the means for dividing.

9. The device of claim 8 wherein said divider comprises a counter, which, in operation, performs said division by the multiple N and outputs said ALM carrier clock, and controlling the parameter of the means for dividing comprises resetting the counter to a determined value based on a previous phase shift between the carrier clock of the reader and the ALM carrier clock of the means for generating in lock mode.

10. The device of claim 5 wherein the means for transmitting transmits near field communication protocol signals.

11. A device, comprising:
a digital phase locked loop (DPLL) including a phase frequency detector, a digital loop filter, a digitally controlled oscillator (DCO) and a divider, wherein the DPLL, in operation, generates an active load modulation (ALM) carrier clock synchronized to a reader carrier clock, the DPLL having a frequency which is a multiple N of a frequency of the carrier clock of the reader, where N is an integer value;
frequency correction circuitry coupled to the DPPL; and
transmission circuitry, which, in operation, transmits data frames to the reader using the ALM carrier clock, wherein the frequency correction circuitry, in operation, determines a frequency difference during transmission of a data frame and generates a control signal to adjust a frequency of the DCO based on the determined frequency difference, wherein the generating the ALM carrier clock includes:
between transmission of data frames, placing said DPLL in a lock mode of operation in which a feedback loop of the DPLL is closed; and
within a transmitted data frame having a duration,
placing, for the duration of the transmitted data frame, said DPLL in a hold mode of operation in which the feedback loop is opened; and
adjusting a phase of said ALM carrier clock at least once during the duration of the transmitted data frame.

12. The device of claim 11 wherein adjusting the phase of said ALM carrier clock at least once during the duration comprises adjusting the ALM carrier clock a plurality of times within each transmitted data frame.

13. The device of claim 11 wherein the divider comprises a counter, which, in operation, divides an output of the DCO by the multiple N and outputs the ALM carrier clock, and, in operation, the counter is reset to a determined value based on a previous phase shift between the carrier clock of the reader and the ALM carrier clock of the DPLL in lock mode.

14. The device claim 13 wherein the frequency correction circuitry, in operation, determines the frequency difference based on a difference between the determined value and an actual value of the counter when the counter is reset to said determined value.

15. The device of claim 11 wherein the frequency correction circuitry includes an adder coupled between the digital loop filter and the DCO, and the adder, in operation, modifies a DCO control word generated by the digital loop filter based on the determined frequency difference.

16. The device of claim 11 wherein the transmission circuitry, in operation, transmits near field communication protocol signals.

17. A system, comprising:

a tag reader, which, in operation, transmits a reader carrier clock; and a tag including:

a digital phase locked loop (DPLL) including a phase frequency detector, a digital loop filter, a digitally controlled oscillator (DCO) and a divider, wherein the DPLL, in operation, generates an active load modulation (ALM) carrier clock synchronized to a reader carrier clock, the DPLL having a frequency which is a multiple N of a frequency of the carrier clock of the reader, where N is an integer value;

frequency correction circuitry coupled to the DPPL; and transmission circuitry, which, in operation, transmits data frames to the reader using the ALM carrier clock, wherein the frequency correction circuitry, in operation, determines a frequency difference during transmission of a data frame and generates a control signal to adjust a frequency of the DCO based on the determined frequency difference, wherein the generating the ALM carrier clock includes:

between transmission of data frames, placing said DPLL in a lock mode of operation in which a feedback loop of the DPLL is closed; and within a transmitted data frame having a duration, placing, for the duration of the transmitted data frame, said DPLL in a hold mode of operation in which the feedback loop is opened; and adjusting a phase of said ALM carrier clock at least once during the duration of the transmitted data frame.

18. The system of claim 17 wherein adjusting the phase of said ALM carrier clock at least once during the duration comprises adjusting the ALM carrier clock a plurality of times within each transmitted data frame.

19. The system of claim 17 wherein the divider comprises a counter, which, in operation, divides an output of the DCO by the multiple N and outputs the ALM carrier clock, and, in operation, the counter is reset to a determined value based on a previous phase shift between the carrier clock of the reader and the ALM carrier clock of the DPLL in lock mode.

20. The system of claim 19 wherein the frequency correction circuitry, in operation, determines the frequency difference based on a difference between the determined value and an actual value of the counter when the counter is reset to said determined value.

21. The system of claim 17 wherein the frequency correction circuitry includes an adder coupled between the digital loop filter and the DCO, and the adder, in operation, modifies a DCO control word generated by the digital loop filter based on the determined frequency difference.

22. The system of claim 17 wherein the transmission circuitry, in operation, transmits near field communication protocol signals.

\* \* \* \* \*